(12) United States Patent
Shimoyama (10) Patent No.: US 10,978,853 B2
(45) Date of Patent: Apr. 13, 2021

(54) OPTICAL SCANNING CONTROL DEVICE AND RETINA SCANNING PROJECTION DEVICE

(71) Applicant: Koichi Shimoyama, Tokyo (JP)

(72) Inventor: Koichi Shimoyama, Tokyo (JP)

(73) Assignee: MITSUMI ELECTRIC CO., LTD., Tokyo (JP)

(*) Notice: Subject to any disclaimer, the term of this patent is extended or adjusted under 35 U.S.C. 154(b) by 198 days.

(21) Appl. No.: 16/332,040

(22) PCT Filed: Sep. 7, 2017

(86) PCT No.: PCT/JP2017/032226
§ 371 (c)(1),
(2) Date: Mar. 11, 2019

(87) PCT Pub. No.: WO2018/061692
PCT Pub. Date: Apr. 5, 2018

(65) Prior Publication Data
US 2019/0363512 A1 Nov. 28, 2019

(30) Foreign Application Priority Data
Sep. 28, 2016 (JP) .............................. JP2016-190213

(51) Int. Cl.
*G02B 26/08* (2006.01)
*H01S 5/024* (2006.01)
(Continued)

(52) U.S. Cl.
CPC ...... *H01S 5/02469* (2013.01); *G02B 26/0833* (2013.01); *G02B 26/10* (2013.01); *H01S 5/042* (2013.01)

(58) Field of Classification Search
CPC . H01S 5/02469; H01S 5/042; G02B 26/0833; G02B 26/10; G02B 26/101;
(Continued)

(56) References Cited

U.S. PATENT DOCUMENTS

2008/0164592 A1* 7/2008 Bakke ................... B81B 7/0067
257/680
2009/0303451 A1 12/2009 Miyake et al.

FOREIGN PATENT DOCUMENTS

JP H3-248597 11/1991
JP H5-299774 11/1993
(Continued)

OTHER PUBLICATIONS

Japanese Office Action dated Jun. 30, 2020 (JP Patent Application No. 2016-190213).
(Continued)

*Primary Examiner* — Euncha P Cherry
(74) *Attorney, Agent, or Firm* — IPUSA, PLLC (57) ABSTRACT

The present invention provides an optical scanning control device and a retina scanning projection device provided with a structure for suppressing heat transfer to a laser module, and a heat dissipation structure for dissipating the heat of the laser module. The optical scanning control device (10) is configured to emit, as image light, a laser light in accordance with an image signal. The optical scanning control device includes: a housing (11) made of metal; a laser module (125) configured to emit laser light, which abuts the top of the base (11a) of the housing, and is arranged on one side inside the housing; a power supply unit (16) arranged inside the housing on a side opposite that of the laser module; and an electronic circuit board (12) having heat source members (IC chips 14) configured to cause the laser module to emit image light, the electronic circuit board being arranged on a side opposite the base-side of the laser module. The heat (Continued)

source members are arranged on a surface on a side of the electronic circuit board facing away from the laser module, and are at positions which avoid a position directly above the laser module.

8 Claims, 6 Drawing Sheets

(51) Int. Cl.
*G02B 26/10* (2006.01)
*H01S 5/042* (2006.01)

(58) Field of Classification Search
CPC .. G02B 27/017; H04N 9/3144; H04N 9/3161; H04N 9/3194; H04N 5/64; H01L 33/00; H05K 7/20
USPC ........................................................ 359/199.1
See application file for complete search history.

(56) References Cited

FOREIGN PATENT DOCUMENTS

| | | |
|---|---|---|
| JP | 2009-302078 | 12/2009 |
| JP | 2012-53323 | 3/2012 |

OTHER PUBLICATIONS

International Search Report for PCT/JP2017/032226 dated Nov. 21, 2017.

* cited by examiner

OPTICAL SCANNING CONTROL DEVICE AND RETINA SCANNING PROJECTION DEVICE

BACKGROUND OF THE INVENTION

1. Field of the Invention

The present disclosure relates to an optical scanning control device and a retina scanning projection device.

2. Description of the Related Art

There is known an optical scanning control device that forms image light from laser light emitted from a laser module. As an example of a display device equipped with the optical scanning control device, a retinal scanning projection device (may also be referred to as a retina scanning projection device) is known. The retinal scanning projection device causes a user to visually recognize an image represented by image data without being affected by a function of a lens of a user's eye, by projecting image light based on the image data on a retina of the user (see Patent Document 1 for example).

CITATION LIST

[Patent Document]
[Patent Document 1] Japanese Unexamined Patent Application Publication No. 2012-053323

SUMMARY OF THE INVENTION

Technical Problem

As a laser module used in an optical scanning control device is weak against heat, it is known that a malfunction such as degradation of laser light and degradation of responsiveness may occur if the laser module is exposed to intense heat. Also, the laser module is one of heat sources.

However, most retinal scanning projection devices are not designed such that heat generated by heat sources other than a laser module, such as an IC chip, is prevented from being transmitted to the laser module, or such that heat generated by a laser module is effectively radiated.

Especially, in a retinal scanning projection device equipped with an optical scanning control device, as the optical scanning control device is carried by a user, it is desirable that the optical scanning control device is configured to radiate heat effectively.

There is a need for an optical scanning control device and a retinal scanning projection device, having a structure for preventing heat from being transmitted to a laser module, and having a heat dissipation structure for radiating heat of the laser module.

Solution to Problem

According to an aspect of the present invention, there is provision of an optical scanning control device for emitting laser light as image light in accordance with an image signal. The optical scanning control device includes: a housing formed of metal; a laser module configured to emit laser light, which is disposed on a base portion of the housing, and is arranged at one side of the housing in a longitudinal direction; a power supply arranged, in the housing, at another side of the housing in the longitudinal direction; and an electronic circuit board including a first surface facing the laser module and a second surface provided with a heat source member. The heat source member is configured to cause the laser module to emit the image light, and is arranged at a first location on the second surface, which is a different location from a second location corresponding to a position directly above the laser module.

According to another aspect of the present invention, there is provision of a retina scanning projection device including an optical scanning control device for emitting laser light as image light in accordance with an image signal, and a head-mounted unit including an optical scanner configured to emit the image light on a retina of a user. The optical scanning control device includes: a housing formed of metal; a laser module configured to emit laser light, which is disposed on a base portion of the housing, and is arranged at one side of the housing in a longitudinal direction; a power supply arranged, in the housing, at another side of the housing in the longitudinal direction; and an electronic circuit board including a first surface facing the laser module and a second surface provided with a heat source member. The heat source member is configured to cause the laser module to emit the image light, and is arranged at a first location on the second surface, which is a different location from a second location corresponding to a position directly above the laser module.

Advantageous Effect of Invention

According to a technique of the present disclosure, an optical scanning control device and a retinal scanning projection device, having a structure for preventing heat from being transmitted to a laser module, and having a heat dissipation structure for radiating heat of the laser module, can be provided.

DETAILED DESCRIPTION OF THE PREFERRED EMBODIMENTS

Embodiment

Figure 1:
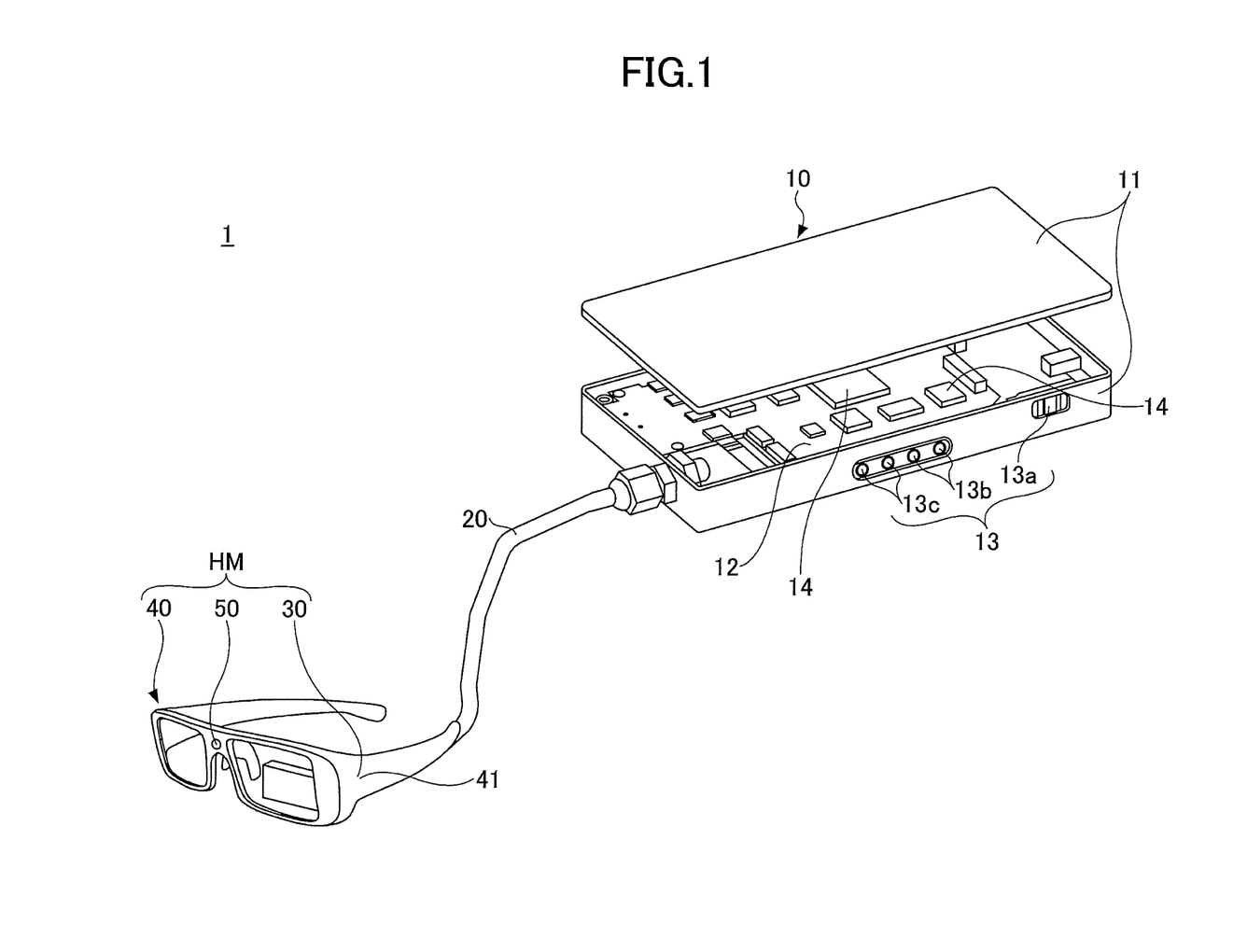
FIG. 1 is a schematic diagram of a retinal scanning projection device to which an optical scanning control device according to an embodiment is applied.

In the following, a retinal scanning projection device to which an optical scanning control device according to an embodiment is applied will be described with reference to FIG. 1. FIG. 1 is a schematic diagram illustrating a structure of the retinal scanning projection device according to the present embodiment.

The retinal scanning projection device 1 according to the present embodiment is a retinal scanning head-mounted display that utilizes Maxwellian view. Maxwellian view is a method of causing a user to visually recognize an image represented by image data without being affected by a function of a lens of the user's eye by projecting image light based on the image data (which may also be referred to as an image light beam, hereinafter) on a retina after the image light is converged once at the center of a pupil.

An overall structure of the retinal scanning projection device 1 will be described. As illustrated in FIG. 1, the retinal scanning projection device 1 includes an optical scanning control device 10, a transmission cable 20, and a head-mounted unit HM.

The optical scanning control device 10 is of a portable size such that the optical scanning control device 10 can be stored in a pocket or the like of a user. The optical scanning control device 10 emits, as image light, laser light having intensity in accordance with an image signal. Details of the optical scanning control device 10 will be described below.

The transmission cable 20 is for transmitting image light emitted from the optical scanning control device 10 to an optical scanner 30.

The head-mounted unit HM includes the optical scanner 30, an eyeglass-type frame 40, and an image capturing unit 50.

The optical scanner 30 projects an image represented by image light on a retina of a user, by emitting the image light transmitted via the transmission cable 20 on an eyeball (retina) of the user while scanning the image light.

The eyeglass-type frame 40 is configured so as to fit to a head of a user. The image capturing unit 50 includes a camera or the like. The optical scanner 30 and the image capturing unit 50 are mounted on the eyeglass-type frame 40.

Note that the above mentioned image light represents light generated based on source information of an image to be projected on a retina of a user by the optical scanner 30. The source information of an image may be a symbol such as a character or a figure, or may be an image.

The optical scanning control device 10 includes a housing 11 that can be operated by a user, an electronic circuit board 12, and an operating unit 13. The operating unit 13 is provided on a side surface of the housing 11. The operating unit 13 includes a power switch 13a, a phase switch 13b, and an adjuster 13c for adjusting an image size. The electronic circuit board 12 is accommodated inside the housing 11. On the electronic circuit board 12, multiple IC chips 14 for embodying operations of the optical scanning control device 10 are mounted.

Figure 2:
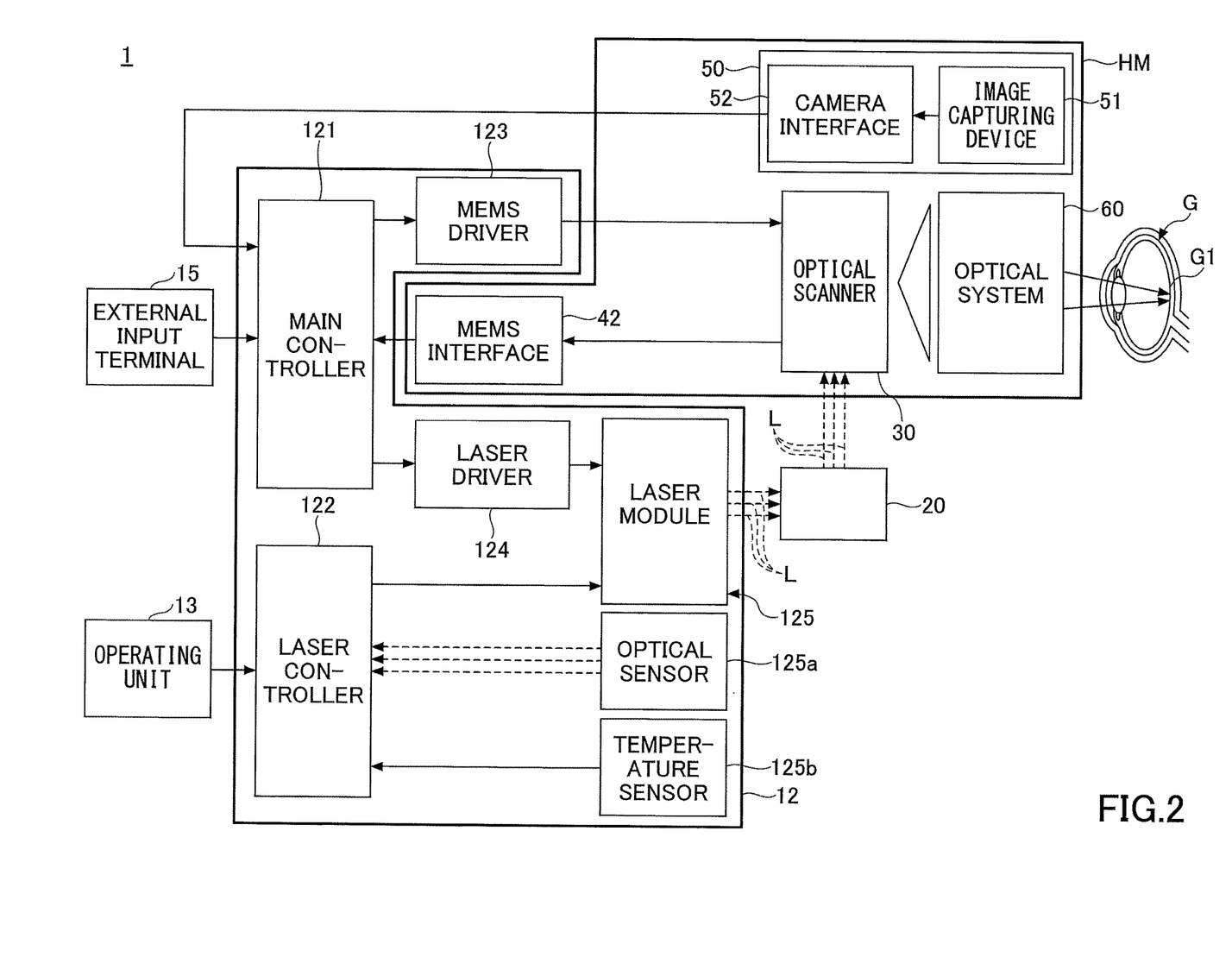
FIG. 2 is a diagram illustrating the retinal scanning projection device according to the embodiment.

The optical scanning control device 10 also includes an external input terminal 15 (see FIG. 2). The optical scanning control device 10 receives content information and the like transmitted from an external device such as a personal computer (not illustrated), through the external input terminal 15. Note that the content information is information to be projected onto a retina of a user, such as a character, an image, and a video image. Specifically, the content information is, for example, a text file, an image file, a video file, etc., used on a personal computer and the like.

The optical scanning control device 10 according to the present embodiment is configured such that an image signal can be input from two different sources. Specifically, an image signal can be input from the image capturing unit 50. In addition, an image signal can be input from an external device.

As the optical scanning control device 10 is configured as described above, the operating unit 13 includes a selection switch (not illustrated) for allowing a user to select whether to project an image signal from the image capturing unit 50 onto a retina, or to project an image signal from an external device onto the retina.

FIG. 2 is a diagram illustrating the retinal scanning projection device according to a first embodiment. In FIG. 2, a configuration of the head-mounted unit HM and a diagram of circuit blocks implemented on the electronic circuit board 12 are illustrated.

First, the head-mounted unit HM will be described.

The head-mounted unit HM according to the present embodiment includes the optical scanner 30, a micro-electro-mechanical system (MEMS) interface 42, the image capturing unit 50, and an optical system 60. The optical scanner 30 is a micro-electro-mechanical system (MEMS) mirror, for example. The optical scanner 30 is disposed at a temple 41 of the eyeglass-type frame 40. The optical scanner 30 scans image light emitted from a laser module 125, which will be described below, in a horizontal direction and in a vertical direction based on a drive control signal. The drive control signal is output from an MEMS driver 123, which will be described below.

Furthermore, as a method of projecting an image onto a retina G1 of an eyeball G by scanning image light, a method such as raster scan can be employed, in which an image is displayed by scanning light at high speed from upper left to lower right in a region on which the image is to be projected.

Image light emitted from the optical scanner 30 is converged by the optical system 60, and is projected on the retina G1. Note that the optical system 60 may be disposed at a lens portion of the eyeglass-type frame 40.

The MEMS interface 42 detects a motion (deflection angle) of the optical scanner 30, and outputs motion information (operation signal) corresponding to a tilt of the optical scanner 30 to a main controller 121 to be described below. Note that the MEMS interface 42 according to the present embodiment may include a temperature sensor (not illustrated), and the MEMS interface 42 may detect a temperature of the optical scanner 30 and output temperature information to the main controller 121.

The image capturing unit 50 according to the present embodiment includes an image capturing device 51 and a camera interface 52.

The image capturing device 51 is a camera including an image sensor such as a complementary metal-oxide-semiconductor (CMOS) image sensor. The camera interface 52 outputs, to the main controller 121 to be described below, an image signal of a camera that is output from the image capturing device 51.

Next, the circuit blocks of the electronic circuit board 12 in the optical scanning control device 10 will be described.

On the electronic circuit board 12, the main controller 121, a laser controller 122, the MEMS driver 123, a laser driver 124, and the laser module 125 (light source) are implemented.

The main controller 121 is embodied by a processor such as a central processing unit (CPU), a random access memory (RAM), a read only memory (ROM), and the like. To the main controller 121, an image signal can be input from two different sources. Specifically, an image signal of the camera output from the image capturing unit 50, and content information (image signal) transmitted from an external device through the external input terminal 15 can be input to the main controller 121. The main controller 121 performs processing of the input image signals and performs drive control of the optical scanner 30 (MEMS mirror).

Furthermore, based on information obtained from the MEMS interface 42, such as the motion information, the temperature information, and the like, the main controller 121 controls driving of the optical scanner (MEMS mirror) and emission of image light from the laser module 125.

The main controller 121 outputs, to the MEMS driver 123, a drive control signal for controlling driving of the optical scanner 30. The MEMS driver 123 outputs the received drive control signal to the optical scanner 30.

Furthermore, the main controller 121 outputs, to the laser driver 124, an image signal entered to the main controller 121. The laser driver 124 generates an emission control signal which is used for on/off control of laser light, based on the image signal. Also, the laser driver 124 outputs the generated emission control signal to the laser module 125.

The laser controller 122 is embodied by a processor such as a CPU, a RAM, a ROM, and the like. When a signal such as a power-on signal, a zoom-in signal, or a zoom-out signal, is input from the operating unit 13, the laser controller 122 outputs a control signal corresponding to the signal to the laser module 125. Note that, in a case in which a selection of specific image data of the data from the two sources is received at the selection switch of the operating unit 13, the laser controller 122 according to the present embodiment outputs a control signal to the laser module 125 in accordance with the selection.

In response to receiving an instruction from the main controller 121, the laser module 125 outputs (emits), for example, laser light L of a single wavelength (or laser light L of multiple wavelengths) to the optical scanner 30. The laser light L is the image light beam for projecting an image onto the retina G1 of the user's eyeball G. Note that the laser light L emitted from the laser module 125 is transmitted to the optical scanner 30 through the transmission cable 20.

For example, the laser module 125 emits a red laser beam (wavelength: approximately from 610 nm to 660 nm), a green laser beam (wavelength: approximately from 515 nm to 540 nm), and a blue laser beam (wavelength: approximately from 440 nm to 480 nm). The red laser beam, the green laser beam, and the blue laser beam, are emitted. The laser module 125 according to the present embodiment is embodied by a light source, in which respective laser diode chips for RGB (read, green, and blue), a device for combining the three colors, and a micro collimating lens are integrated, for example.

The laser module 125 also includes an optical sensor 125a and a temperature sensor 125b. The optical sensor 125a detects a light amount of each laser diode in the laser module 125, and outputs the detected light amount information to the laser controller 122. The temperature sensor 125b detects a temperature of each of the laser diodes in the laser module 125, and outputs the detected temperature information to the laser controller 122.

The laser controller 122 generates a signal for controlling a light amount of each laser diode in the laser module 125, based on the light amount information obtained from the optical sensor 125a, and the laser controller 122 outputs the generated signal to the laser module 125. Accordingly, luma of an image projected on the retina G1 can be appropriately controlled.

<Optical Scanning Control Device>

Figure 3:
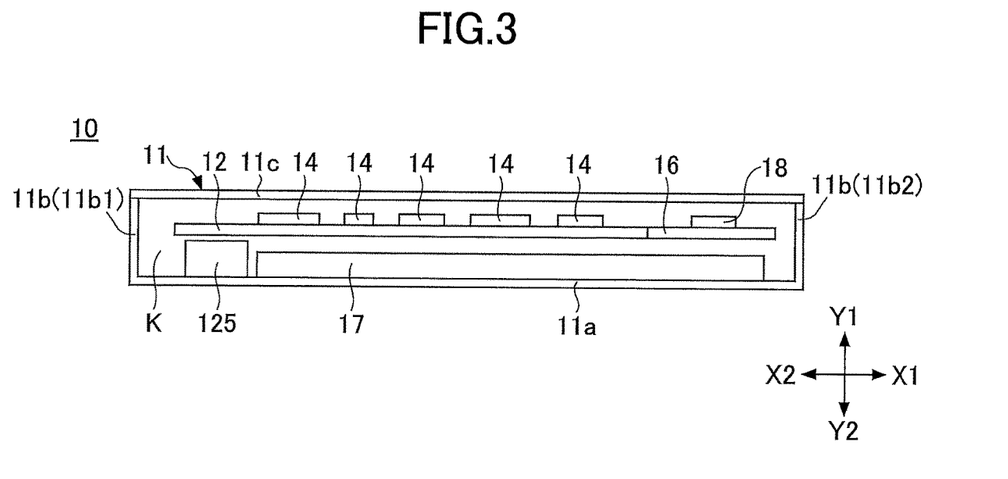
FIG. 3 is a side view of the optical scanning control device according to the embodiment, which is illustrated so that an inside of the optical scanning control device can be seen in order to describe an internal structure.
Figure 4A:
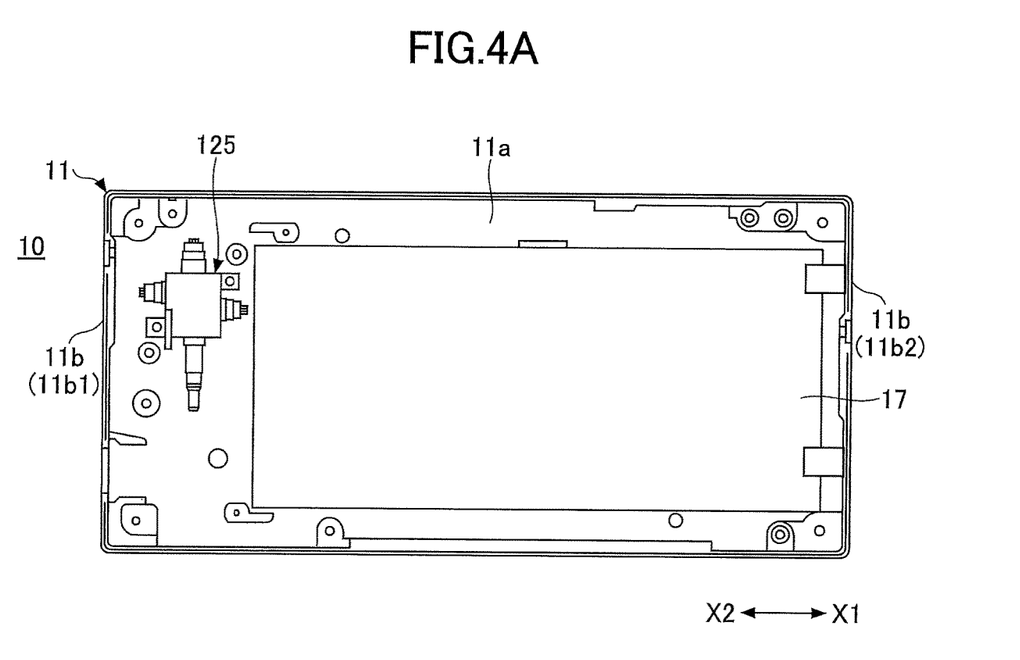
FIG. 4A is a plan view of the optical scanning control device in a state in which an electronic circuit board and a power supply are removed.
Figure 4B:
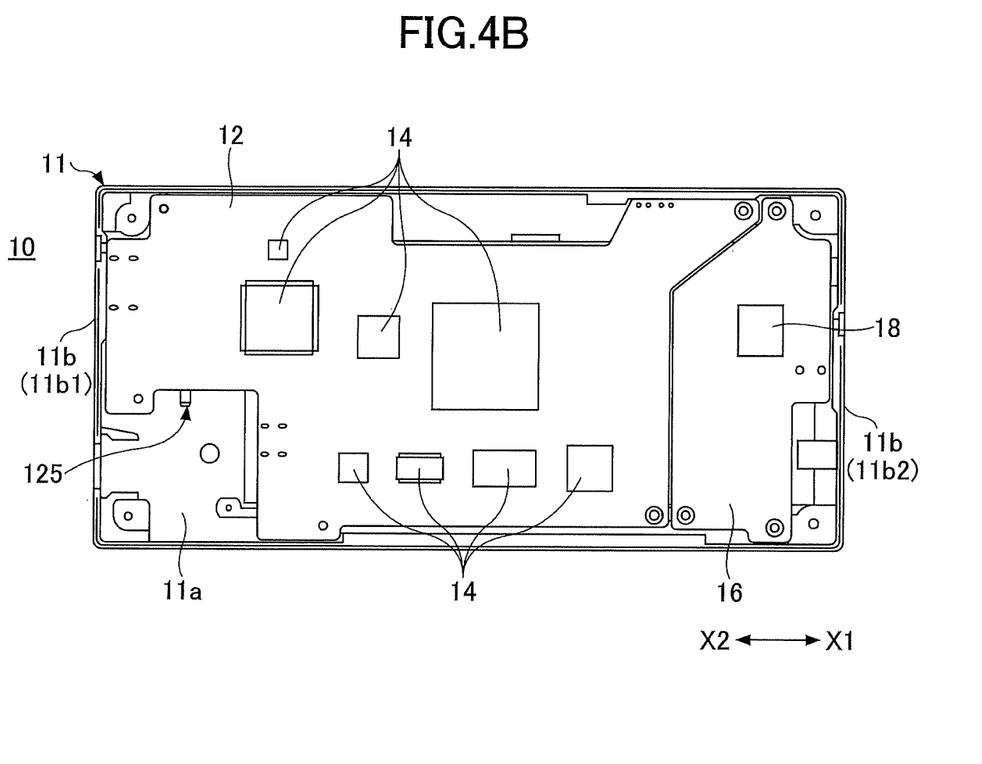
FIG. 4B is a plan view of the optical scanning control device illustrating an internal structure.

Next, the optical scanning control device 10 will be described with reference to FIG. 3, FIG. 4A, and FIG. 4B. FIG. 3 is a side view of the optical scanning control device according to the present embodiment, which is illustrated so that an inside of the optical scanning control device 10 can be seen in order to describe an internal structure. FIG. 4A is a plan view of the optical scanning control device 10 in a state in which the electronic circuit board 12 and a power supply 16 are removed. FIG. 4B is a plan view of the optical scanning control device 10 illustrating an internal structure of the optical scanning control device 10 in FIG. 3. In FIG. 4A and FIG. 4B, the optical scanning control device 10 in a state in which a cover 11c of the housing 11 is removed is illustrated, in order to describe the internal structure.

The optical scanning control device 10 includes the housing 11 made of metal that can be operated by a user. Examples of the metal used for the housing 11 include aluminum, copper, and iron. The housing 11 includes a base portion 11a, a side portion 11b, and the cover 11c, and a space K is formed by the base portion 11a, the side portion 11b, and the cover 11c. The housing 11 is of a rectangular shape in a plan view. However, a shape of the housing 11 is not limited to a rectangular shape. With respect to the side portion 11b, the side portion 11b located at a left side (an arrow X2 side) in the drawings is referred to as a "side portion 11b1", and the side portion 11b located at a right side (an arrow X1 side) in the drawings is referred to as a "side portion 11b2".

In the space K of the housing 11, the electronic circuit board 12, the power supply 16, the laser module 125, a battery 17 serving as an electrical storage device, and the multiple IC chips 14 that are heat sources, are included.

The laser module 125 is, as described above, an element for emitting laser light, and the laser module 125 is itself a heat source member. The laser module 125 according to the present embodiment is disposed directly on the base portion 11a such that the laser module 125 is in contact with the base portion 11a. Accordingly, heat emitted from the laser module 125 is directly transmitted to the housing 11 of metal, and the heat is radiated by the housing 11.

Also, in the housing 11, the laser module 125 according to the present embodiment is arranged at one side of the base portion 11a of the housing 11 in a longitudinal direction (X1-X2 direction in FIG. 3). The laser module 125 illustrated in the drawing is arranged, in the longitudinal direction of the housing 11, in a vicinity of the side portion 11b1 (at a side of an arrow X2).

On the electronic circuit board 12, the multiple IC chips 14 of heat source members are placed. The electronic circuit board 12 is on the opposite side of the laser module 125 with respect to the base portion 11a, in a vertical direction (Y1-Y2 direction) in FIG. 3. The electronic circuit board 12 is formed in a rectangular shape larger than the laser module 125. Thus, a part of a side end (at an arrow X2 side) of the electronic circuit board 12 is located directly above the laser module 125 in the vertical direction in FIG. 3.

In the electronic circuit board 12 according to the present embodiment, the multiple IC chips 14 are on an opposite surface of a first surface of the electronic circuit board 12 facing the laser module 125 (the opposite surface may also be referred to as a second surface, or an upper surface). Also, the multiple IC chips 14 are arranged at a first location on the upper surface of the electronic circuit board 12, which is a different location from a second location on the upper surface of the electronic circuit board 12 directly above the laser module 125. That is, the electronic circuit board 12 is configured such that heat generated by the IC chips 14 (which are heat sources) is prevented from being transmitted to the laser module 125 to the extent possible. Thus, occurrence of malfunction such as degradation of laser light and degradation of responsiveness, caused by the laser module 125 being exposed to heat, can be avoided.

The power supply 16 is arranged in a vicinity of the side portion 11b2 (on an arrow X1 side), which is positioned, in the longitudinal direction of the housing 11, opposite the side portion 11b1 near which the laser module 125 is arranged.

The battery 17 provides the power supply 16 with electric power. The battery 17 is arranged between the base portion 11a and the first surface of the electronic circuit board 12 facing the laser module 125. Also, in the longitudinal direction of the housing 11, the battery 17 is arranged closely next to the laser module 125. The battery 17 is itself a heat source member. Thus, it is preferable that the battery 17 is disposed directly on the base portion 11a of the housing 11 so as to be in contact with the base portion 11a. It is known that a battery 17 is generally weak against heat. However, as the battery 17 according to the present embodiment is disposed directly on the housing 11 so as to be in contact with the base portion 11a, heat generated from the battery 17 can be radiated to outside via the housing 11. Further, with respect to the electronic circuit board 12 arranged on the opposite side (upper side, an arrow Y1 side) of the battery 17 with respect to the base portion 11a in the vertical direction (Y1-Y2 direction), as the IC chips 14 which are heat source members are not disposed on the first surface facing the battery 17, the electronic circuit board 12 is configured such that heat generated by the IC chips 14 is prevented from being transmitted to the battery 17 to the extent possible.

Generally, a protection IC, which is a protective circuit, is provided at a side surface in a transverse direction (a direction orthogonal to the longitudinal direction) of a typical battery 17. Thus, in the typical battery 17, a thickness of the typical battery 17 is affected by a thickness of the protection IC 18. However, in the present embodiment, the protection IC 18 is not attached to the battery 17. Instead, in the present embodiment, the protection IC is placed on the power supply 16. Therefore, in the present embodiment, if a thin type battery is used as the battery 17, a size of the housing 11 in a thickness direction required for accommodating the battery 17 can be minimized, and the housing 11 can be downscaled.

The IC chips 14 are arranged as illustrated in FIG. 4B, for example. Examples of the IC chips 14 to be heat source members include a laser driver, a high-definition multimedia interface (HDMI (registered trademark)) receiver, a distortion adjusting circuit, an analog-digital converter (ADC), a main controller, and a laser controller.

Note that the electronic circuit board 12 and the power supply 16 illustrated in the drawings are separate members and are configured to be detachable. However, the electronic circuit board 12 and the power supply 16 may be an integrated component.

Another Embodiment

Figure 5:
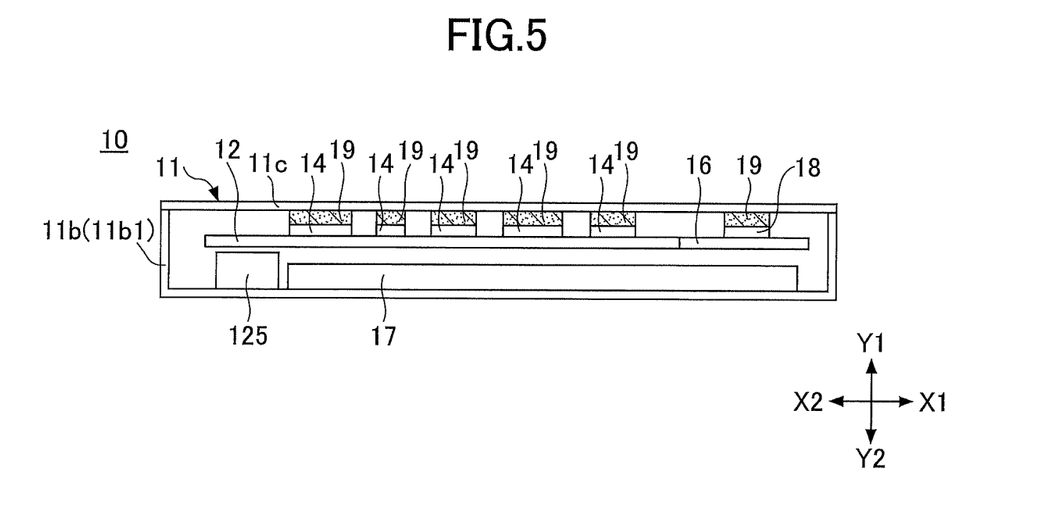
FIG. 5 is a side view of an optical scanning control device according to another embodiment, which is illustrated so that an inside of the optical scanning control device can be seen in order to describe an internal structure.

Next, an optical scanning control device 10 according to another embodiment will be described with reference to FIG. 5. FIG. 5 is a side view of the optical scanning control device 10 according to an embodiment to be described below, which is illustrated so that an inside of the optical scanning control device 10 can be seen in order to describe an internal structure. As the optical scanning control device 10 according to the embodiment to be described below has a similar structure to that described above, descriptions of matters that are common to those in the above described embodiment will be omitted.

The optical scanning control device 10 according to the present embodiment (embodiment to be described below) differs from that in the above described embodiment in that heat transmitting members 19 are provided between multiple IC chips 14 and a back surface of a cover 11c of a housing 11, and/or between a protection IC 18 and the cover 11c of the housing 11. The heat transmitting member 19 is a silicon type heat dissipation sheet. Alternatively, the heat transmitting member 19 may be heat dissipation grease or a graphite sheet.

The heat transmitting member 19 is arranged so as to contact an upper surface of the IC chips 14 (may also include the protection IC 18) and the back surface of the cover 11c. Accordingly, the heat transmitting member 19 can transmit heat generated by the IC chips 14 and the protection IC 18 to the housing 11, and can radiate the heat from the housing 11. Therefore, the heat transmitting member 19 can minimize heat transmitted from the IC chips 14 and the protection IC 18 to the laser module 125.

First Modified Example

Figure 6A:
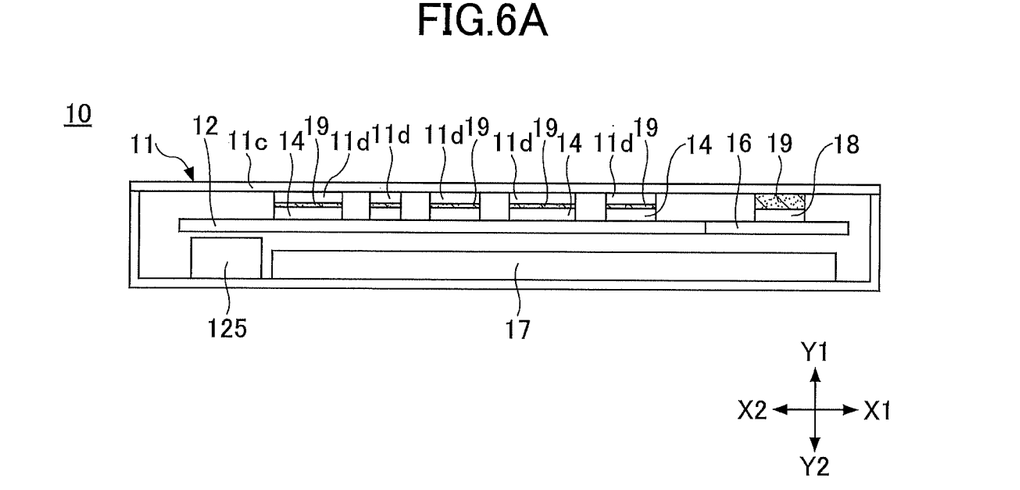
FIG. 6A is a side view of an optical scanning control device for describing a first modified example of the optical scanning control devices according to said another embodiment, which is illustrated so that an inside of the optical scanning control device can be seen.
Figure 6B:
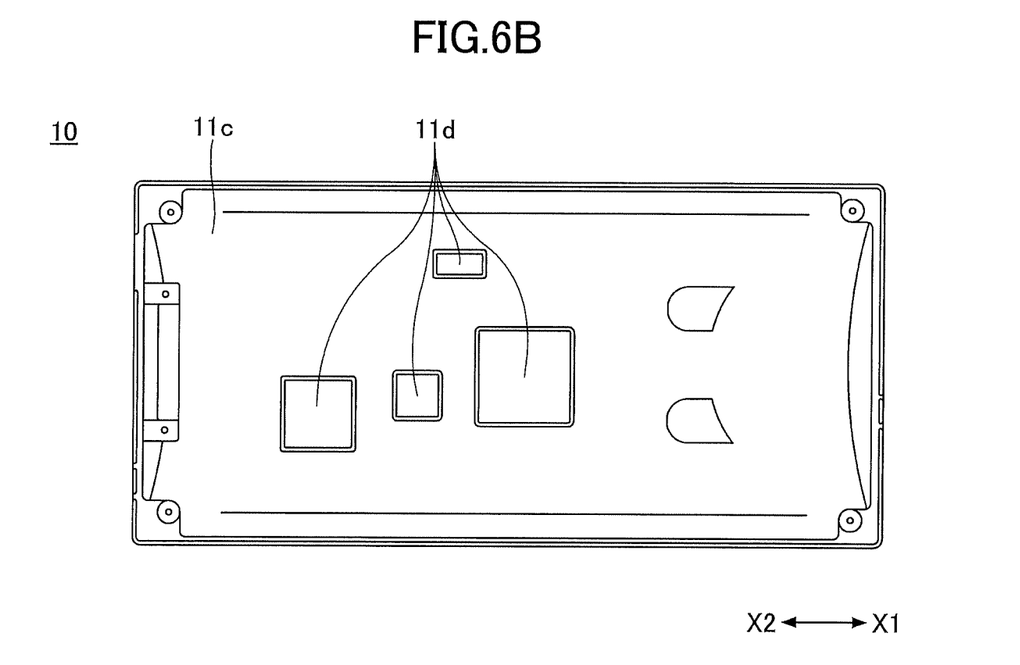
FIG. 6B is an exemplary diagram illustrating a structure of a back surface of a cover of the optical scanning control device illustrated in FIG. 6A.

Next, a first modified example of the optical scanning control devices 10 according to the aforementioned embodiments will be described with reference to FIG. 6A and FIG. 6B. FIG. 6A is a side view of an optical scanning control device 10 for describing the first modified example of the optical scanning control devices 10 according to the aforementioned embodiments, which is illustrated so that an inside of the optical scanning control device 10 can be seen. FIG. 6B is an exemplary diagram illustrating a structure of a back surface of a cover 11c of the optical scanning control device 10 illustrated in FIG. 6A.

Heat conductivity of the heat transmitting member 19 described above with reference to FIG. 5 is lower than heat conductivity of metal forming the housing 11. Thus, in the first modified example, projections 11d projecting toward an inside (an arrow Y2 direction) are formed on the back surface of the cover 11c of the housing 11, and the heat transmitting members 19 are provided between IC chips 14 and the projections 11d. The projections 11d are made from the same metal as the housing 11.

According to the structure, the heat transmitting members 19 having lower heat conductivity can be made to be thinner. Therefore, heat generated by the IC chips 14 and the protection IC 18 can be transmitted to the housing 11 with low heat resistance, and heat dissipation capability of the housing 11 can improve.

It is preferable that all the IC chips 14 have their corresponding projections 11d. However, as illustrated in FIG. 6B, projections 11d of the same number of the IC chips 14 having especially high heating values may be provided, shapes of the projections 11d may be respectively formed to shapes of the corresponding IC chips 14, and the projections 11d may be respectively provided at locations of the corresponding IC chips 14. The projections 11d illustrated in FIG. 6B are formed such that the projections 11d correspond to an HDMI receiver, a distortion adjusting circuit, an analog-digital converter (ADC), and a main controller, respectively.

Second Modified Example

Figure 7:
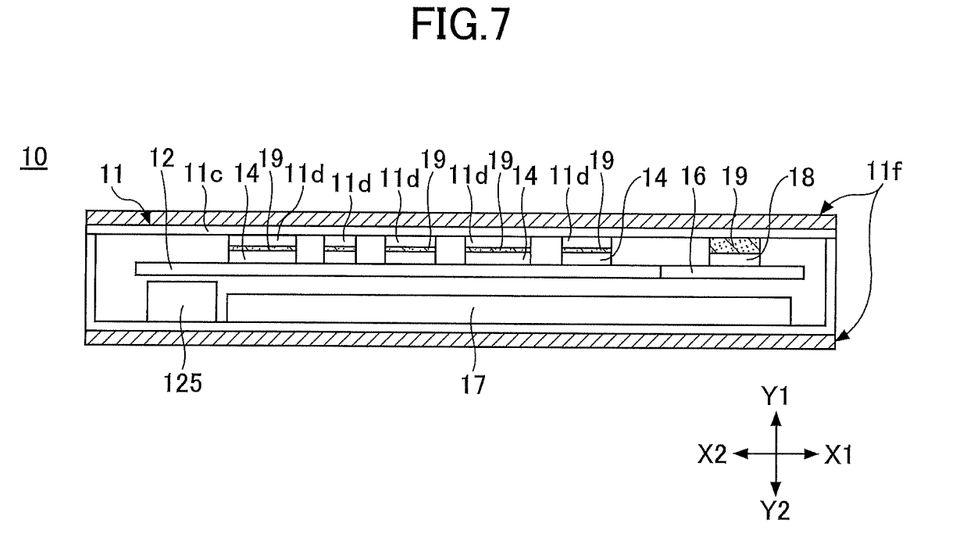
FIG. 7 is a diagram for describing a second modified example of the optical scanning control devices according to the embodiments.

FIG. 7 is a diagram for describing a second modified example of the optical scanning control devices 10 according to the aforementioned embodiments.

In the second modified example of the optical scanning control devices 10 according to the aforementioned embodiments, heat radiation fins 11f are provided on an outer surface of a housing 11. By providing the heat radiation fins 11f, efficiency of heat radiation of the housing 11 is improved. The heat radiation fins 11f may be fins used for a heat sink.

An optical scanning control device and a retina scanning projection device have been described above, with reference to embodiments. However, an optical scanning control device and a retina scanning projection device according to the present invention are not limited to the above described embodiments. Various variations or enhancements may be made without departing from the scope of the invention.

The present application is based on and claims priority to Japanese Patent Applications No. 2016-190213 filed on Sep. 28, 2016, the entire contents of which are hereby incorporated by reference.

DESCRIPTION OF THE REFERENCE NUMERALS 1 retinal scanning projection device
10 optical scanning control device
11 housing
11a base portion
11c cover
11d projection
11f heat radiation fin
12 electronic circuit board
121 main controller
122 laser controller
123 MEMS driver
124 laser driver
125 laser module
13 operating unit
14 IC chip (heat source)
15 external input terminal
16 power supply
17 battery (electrical storage device)
18 protection IC (protective circuit)
19 heat transmitting member
20 transmission cable
30 optical scanner
40 eyeglass-type frame
42 MEMS interface
50 image capturing unit
51 image capturing device
52 camera interface
60 optical system
G eyeball
G1 retina
L laser light
HM head-mounted unit

What is claimed is:

1. An optical scanning control device for emitting laser light as image light in accordance with an image signal, the optical scanning control device comprising:
a housing formed of metal;
a laser module configured to emit the laser light, the laser module being disposed on a base portion of the housing, and being arranged at one side of the housing in a longitudinal direction of the housing;
a power supply provided in the housing and arranged, in the longitudinal direction, at a side opposite the one side at which the laser module is arranged;
an electronic circuit board provided above the laser module; and
a heat source member disposed on an upper surface of the electronic circuit board, the heat source member being configured to cause the laser module to emit the image light; wherein
the heat source member is disposed, on the upper surface of the electronic circuit board, at a location just under which the laser module is not placed.

2. An optical scanning control device for emitting laser light as image light in accordance with an image signal, the optical scanning control device comprising:
a housing formed of metal;
a laser module configured to emit the laser light, the laser module being disposed on a base portion of the housing, and being arranged at one side of the housing in a longitudinal direction of the housing;
a power supply provided in the housing and arranged, in the longitudinal direction, at a side opposite the one side at which the laser module is arranged;
an electronic circuit board including a first surface facing the laser module and a second surface provided with a heat source member, the second surface being on a side opposite the first surface, the heat source member being configured to cause the laser module to emit the image light; and
an electrical storage device configured to provide the power supply with electric power; wherein
the heat source member is arranged at a first location on the second surface, the first location being different from a second location corresponding to a position directly above the laser module,
the electrical storage device is provided on a same side of the electronic circuit board as the laser module,
the electrical storage device is arranged adjacent to the laser module in the longitudinal direction, and
a protective circuit for the electrical storage device is provided at the power supply.

3. The optical scanning control device according to claim 2, further comprising a heat transmitting member provided between a cover of the housing and at least one of the heat source member and the protective circuit.

4. The optical scanning control device according to claim 3, wherein the heat transmitting member is a heat dissipation sheet, heat dissipation grease, or a graphite sheet.

5. The optical scanning control device according to claim 3, further comprising a projection formed on a back surface of the cover of the housing, wherein the heat transmitting member is provided between the projection and the at least one of the heat source member and the protective circuit.

6. The optical scanning control device according to claim 1, wherein heat radiation fins are provided at an outer surface of the housing.

7. The optical scanning control device according to claim 1, wherein the electronic circuit board and the power supply are integrated.

8. A retina scanning projection device comprising:
an optical scanning control device for emitting laser light as image light in accordance with an image signal; and a head-mounted unit including an optical scanner configured to emit the image light on a retina of a user;

the optical scanning control device including
- a housing formed of metal;
- a laser module configured to emit the laser light, the laser module being disposed on a base portion of the housing, and being arranged at one side of the housing in a longitudinal direction of the housing;
- a power supply provided in the housing and arranged, in the longitudinal direction, at a side opposite the one side at which the laser module is arranged;
- an electronic circuit board provided above the laser module; and
- a heat source member disposed on an upper surface of the electronic circuit board, the heat source member being configured to cause the laser module to emit the image light;
- wherein the heat source member is disposed, on the upper surface of the electronic circuit board, at a location just under which the laser module is not placed.

* * * * *